United States Patent [19]

Mehregany et al.

[11] Patent Number: 5,705,318
[45] Date of Patent: Jan. 6, 1998

[54] MICROMOTORS AND METHODS OF FABRICATION

[75] Inventors: Mehran Mehregany, Pepper Pike, Ohio; Keren Deng, Camas, Wash.

[73] Assignee: Case Western Reserve University, Cleveland, Ohio

[21] Appl. No.: 254,920

[22] Filed: Jun. 6, 1994

[51] Int. Cl.$^6$ .................................................. H02K 15/02
[52] U.S. Cl. ............................ 430/312; 430/314; 430/319; 216/2; 310/40 MM
[58] Field of Search ........................... 430/320, 312, 430/314, 319; 216/2; 310/40 MM

[56] References Cited

U.S. PATENT DOCUMENTS

| | | | |
|---|---|---|---|
| 4,528,071 | 7/1985 | Glashauser | 204/11 |
| 4,579,616 | 4/1986 | Windischmann et al. | 156/160 |
| 4,677,042 | 6/1987 | Kato et al. | 430/5 |
| 4,708,919 | 11/1987 | Shimkunas et al. | 430/5 |
| 4,738,010 | 4/1988 | Ehrfeld et al. | 29/149.5 |
| 4,797,211 | 1/1989 | Ehrfeld et al. | 210/321.84 |
| 4,821,997 | 4/1989 | Zdeblick | 251/11 |
| 4,824,073 | 4/1989 | Zdeblick | 251/11 |
| 4,897,360 | 1/1990 | Guckel et al. | 437/7 |
| 4,923,772 | 5/1990 | Kirch et al. | 430/5 |
| 4,943,032 | 7/1990 | Zdeblick | 251/11 |
| 4,943,750 | 7/1990 | Howe et al. | 310/309 |
| 4,966,646 | 10/1990 | Zdeblick | 156/633 |
| 4,996,082 | 2/1991 | Guckel et al. | 427/99 |
| 4,997,521 | 3/1991 | Howe et al. | 216/17 |
| 5,013,693 | 5/1991 | Guckel et al. | 437/248 |
| 5,043,043 | 8/1991 | Howe et al. | 156/645 |
| 5,045,439 | 9/1991 | Maner et al. | 430/394 |
| 5,066,533 | 11/1991 | American et al. | 428/156 |
| 5,069,419 | 12/1991 | Jerman | 251/11 |
| 5,093,594 | 3/1992 | Mehregany | 310/82 |
| 5,162,078 | 11/1992 | Bley et al. | 205/75 |
| 5,185,056 | 2/1993 | Fuentes et al. | 156/639 |
| 5,189,777 | 3/1993 | Guckel et al. | 29/424 |
| 5,190,637 | 3/1993 | Guckel | 205/118 |
| 5,206,983 | 5/1993 | Guckel et al. | 29/598 |
| 5,252,881 | 10/1993 | Muller et al. | 310/40 MM |
| 5,260,175 | 11/1993 | Kowanz et al. | 430/326 |
| 5,270,125 | 12/1993 | America et al. | 428/698 |
| 5,296,775 | 3/1994 | Cronin et al. | 310/309 |
| 5,298,367 | 3/1994 | Hoessel et al. | 430/326 |
| 5,334,467 | 8/1994 | Cronin et al. | 430/5 |
| 5,342,737 | 8/1994 | Georger, Jr. et al. | 430/324 |
| 5,350,499 | 9/1994 | Shibaike et al. | 204/192.34 |
| 5,376,506 | 12/1994 | Ehrfeld et al. | 430/321 |
| 5,378,583 | 1/1995 | Guckel et al. | 430/325 |
| 5,554,304 | 9/1996 | Suzuki | 216/2 |

FOREIGN PATENT DOCUMENTS

| | | |
|---|---|---|
| 510629 | 10/1992 | European Pat. Off. . |
| 592094 | 4/1994 | European Pat. Off. . |
| 4156508 | 5/1992 | Japan . |
| 4328715 | 11/1992 | Japan . |
| 5142405 | 6/1993 | Japan . |
| 6054555 | 2/1994 | Japan . |

OTHER PUBLICATIONS

Jerman, "Electrically–Activated, Normally–Closed Diaphragm Valves," *Transducers '91, Digest of Technical Papers*, 1991 International Conference on Solid–State Sensors and Actuators, pp. 1045–1048.

(List continued on next page.)

*Primary Examiner*—John A. McPherson
*Attorney, Agent, or Firm*—Klarquist Sparkman Campbell Leigh & Whinston, LLP

[57] ABSTRACT

A polysilicon micromotor, of either inner rotor or outer rotor design, is fabricated with a process that uses as few as three mask steps. In an outer rotor (wobble) micromotor, a free-rotating insulating flange bearing mechanically couples the inner periphery of the rotor to the stator, permitting the outer periphery of the rotor to be directly coupled to other mechanisms. The dielectric constant of the flange bearing increases motive torque of the motor as contrasted with air-gap designs. This and other factors results in motive torque, in the illustrated embodiment, more than 100 times larger than in previous designs. Among its other benefits, the disclosed fabrication process results in in-place formation of all motor elements, and enables precise definition of the rotor/stator gap.

10 Claims, 2 Drawing Sheets

OTHER PUBLICATIONS

Jerman, "Electrically-Activated, Micromachines Diaphragm Valves," *Technical Digest*, IEEE Solid–State Sensor Workshop, 1990, pp. 65–69.

Long–Sheng Fan et al., "Integrated Movable Micromechanical Structures for Sensors and Actuators," *IEEE Transactions on Electron Devices*, vol. 35, No. 6, Jun. 1988, pp. 724–730.

Bryzek et al., "Micromachines on the March," *IEEE Spectrum*, May 1994, pp. 20–31.

Furuhata et al., "Outer Rotor Surface–Micromachines Wobble Micromotor," *IEEE Micro Electro Mechanical Systems*, Feb. 1993, pp. 161–1666.

Folta et al., "Design, Fabrication and Testing of a Miniature Peristaltic Membrane Pump," *IEEE*, 1992, pp. 186–189.

Zdeblick, et al., "A Microminiature Electric–to–Fluidic Valve," *Wescon '87 Proceedings*, pp. 24/4/1–2, Nov. 18, 1987.

Van De Pol, et al., "A Thermopneumatic Micropump Based on Micro–Engineering Techniques," *Elsevier Sequoia*, Printed in The Netherlands, 1990, pp. 198–202.

Deng et al., "Outer–rotor Polysilicon Wobble Micromotors," *Proceedings IEEE Micro Electro Mechanical Systems An Investigation of Micro Structures, Sensors, Actuators, Machines and Robotic Systems*, Jan. 25–28, 1994, pp. 269–272.

DEFINE STATOR AND ROTOR WITH FIRST MASK

DEFINE FLANGE BEARING MOLD BASE WITH SECOND MASK

DEFINE FLANGE BEARING TOP WITH THIRD MASK

MICROMOTORS AND METHODS OF FABRICATION

BACKGROUND AND SUMMARY OF THE INVENTION

Micromotors have been the subject of extensive academic and commercial investigation, both in the United States and abroad, for several years. However, despite this focused effort, a number of problems remain in the basic design of micromotors, and in methods of their fabrication.

Before proceeding further it should be noted that there are two basic types of micromotors: inner rotor and outer rotor. Inner rotor micromotors are more conventional in design and use a rotor centrally positioned within a circular array of stator elements. Outer rotor micromotors, in contrast, position the stator elements in the center, and the rotor takes the form of a ring or like shape mounted for rotation about the central stator. For many applications, outer rotor micromotors offer the most promise.

Illustrative of the former state of the art in outer rotor motors is Furuhata et al., "Outer Rotor Surface-Micromachined Wobble Micromotor," Proc. IEEE Conf. on Micro Electro Mechanical Systems, 1993, pp. 161–166. However, Furuhata suffers from a number of drawbacks.

A major drawback is that the fabrication of the micromotor requires manual placement of the rotor, as by a micro manipulator.

Once installed, the Furuhata rotor lies unsecured on the substrate and can be dislodged if the substrate is inverted.

U.S. Pat. Nos. 5,093,594 and 5,043,043 disclose inner rotor micromotors which don't require manual rotor placement, and which secure the rotor in-place by a central bearing. However, as noted, inner rotor micromotors are disadvantageous in many applications. Further, the fabrication techniques disclosed in these patents are still quite complex, often requiring many masking steps (e.g. more than five).

It is an object of the preferred embodiment of the present invention to overcome the above-noted and other drawbacks of the prior art.

In accordance with the preferred embodiment of the present invention, a micromotor is fabricated using just three mask steps. In addition to simplicity, this fabrication process also results in in-place formation of the micromotor rotor. The rotor is secured in-place by a flange bearing which is fabricated as part of the three mask process. In outer rotor embodiments, the flange bearing can provide electrical insulation between the rotor and stator, thereby increasing motive torque. Outer rotor embodiments can also be of the exposed periphery type, allowing the rotor to be toothed to permit driving of other mechanisms fabricated on the same substrate.

The foregoing and additional features and advantages of the present invention will be more readily apparent from the following detailed description, which proceeds with reference to the accompanying drawings.

DETAILED DESCRIPTION

Figures 1, 4:
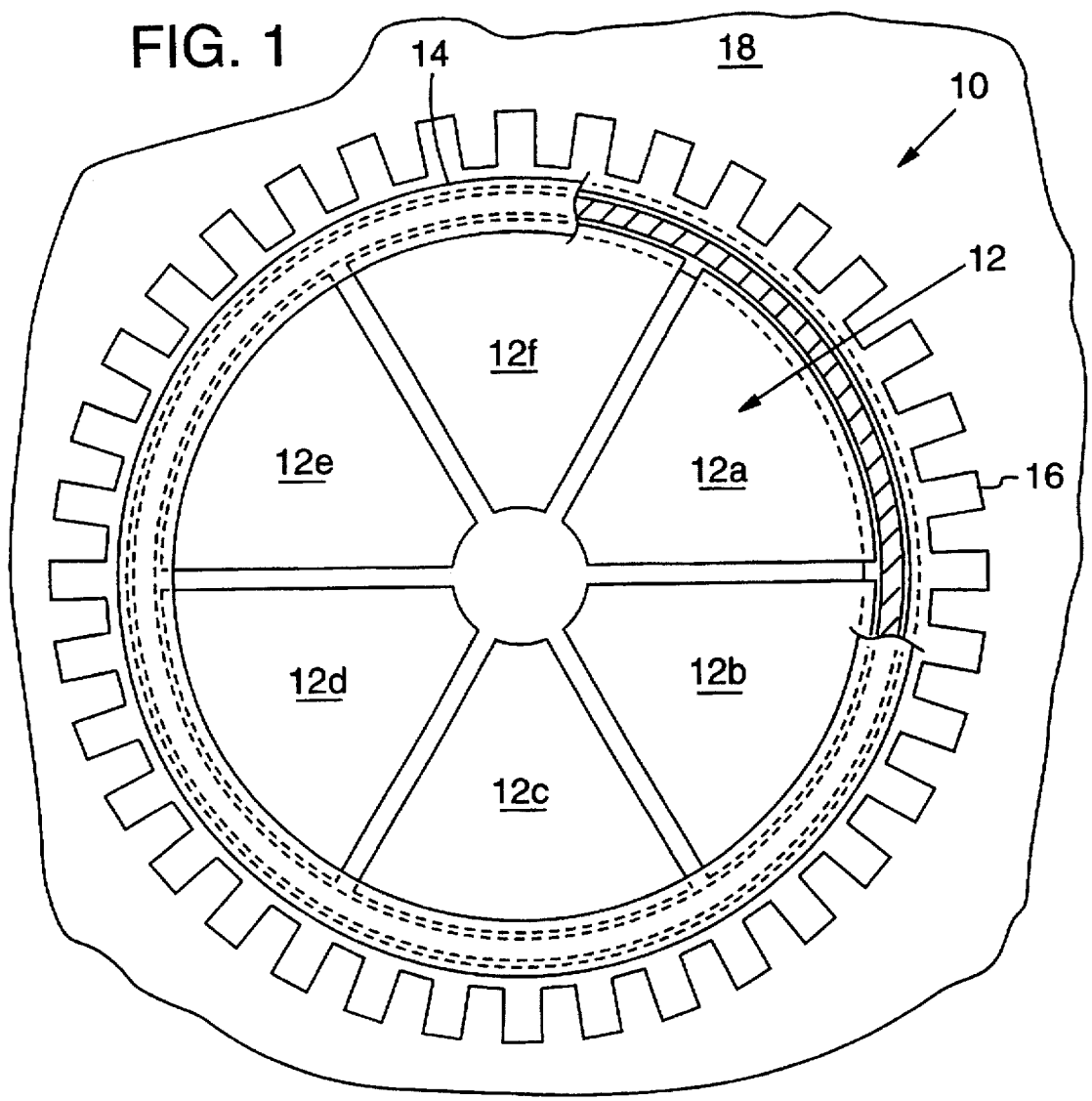
FIG. 1 is a top plan view of an outer rotor micromotor according to one embodiment of the present invention.
FIG. 4 is a flow chart detailing certain steps of a micromotor fabrication process according to the present invention.

Referring to FIG. 1, an outer rotor micromotor 10 according to one embodiment of the present invention includes a stator 12, a flange bearing 14, and a rotor 16. The stator 12 includes a plurality of poles, such as 12a–12f, which are driven in sequence to electrostatically attract the rotor 16 and effect rotation. (For clarity of illustration, the rotor and bearing in FIG. 1 are depicted as centered on the stator—the position in which they are fabricated.)

Fabrication Process

Referring to FIGS. 2A–2E, a silicon wafer 18 serves as the substrate for the illustrated micromotor 10. The thickness of the substrate is not particularly critical; since the process of fabrication is surface micromachining, the substrate simply acts as a mechanical support for the motor. However, the use of a semiconductor substrate allows for integration of electronics which allows the integration of micromotors and mechanisms with drive and detection circuitry.

On substrate 18 is deposited a layer of silicon dioxide 20. In the preferred embodiment, this deposition is accomplished by low pressure chemical vapor deposition (LPCVD) using an LTO process with silane and oxygen, and results in a layer 2.4 microns thick. This LTO layer 20 serves as substrate/stator isolation, as well as a sacrificial layer under the rotor.

Next, a 3–5 micron layer of polysilicon 22 is deposited, again via LPCVD. To make this layer more conductive, the polysilicon is heavily doped with phosphorous. In the preferred embodiment, this is done by a thermal diffusion process, although other techniques can be used.

Before patterning the top polysilicon layer 22, a hard mask layer 24, having a thickness of 0.3 to 1 micron, is first formed. This is done by a thermal oxidation process.

After formation of the hard mask layer 24, the wafer is coated, as by spin coating, with a 1 micron layer of photoresist. The wafer is then exposed by a conventional exposure technique through a mask that defines the stator poles 12a–12f, and the rotor 16. (A 5X wafer stepper is used in the preferred process; in other embodiments contact printing or other exposure techniques could of course be used.) The wafer is then developed, dissolving the exposed photoresist and uncovering selected areas of the hard mask layer 24.

The hard mask layer 24 is etched by reactive ion etching (aka plasma etching or dry etching) using the photoresist as a mask. The hard mask layer could be etched by wet chemical means, with a slight loss in definition accuracy.

The wafer is next etched to remove the polysilicon layers 24, 22, thereby defining the rotor 16, stator 12, and rotor/stator gap 26. This etching is done by reactive ion etching, although wet chemical etching could again be used with some compromise of definition.

Figure 2A:
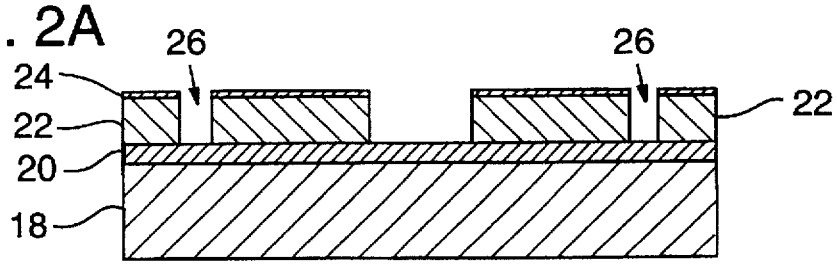
FIGS. 2A–2E are cross-sectional views showing steps in the fabrication of the micromotor of FIG. 1.
Figure 2B:
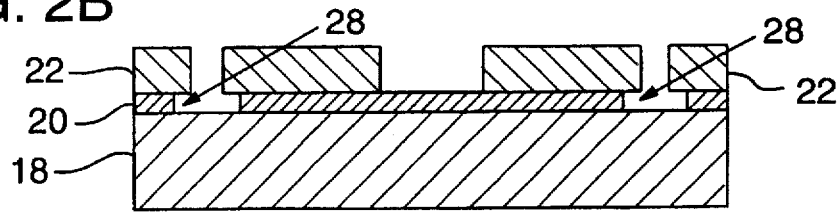

Next, photoresist is again applied, and exposed through a mask that exposes only the region where the flange bearing 14 is to be formed. After developing, wet chemical etching (e.g. HF) is used to form the undercut 28 under the polysilicon layer 22 (FIG. 2B).

Figure 2C:
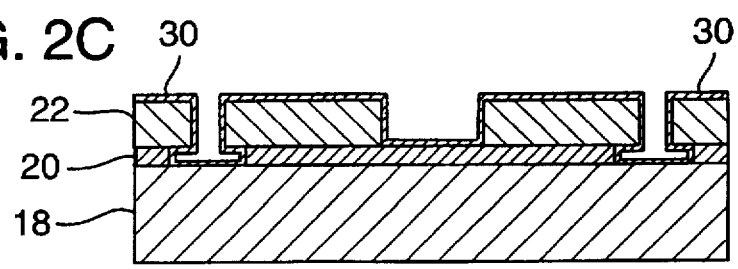

The resist is then removed and the wafer put in a thermal oxidation furnace to form a layer 30 of silicon dioxide, approximately 0.3 microns thick, over the entire wafer surface. This layer determines the bearing clearance 32 (FIG. 2C).

Figure 2D:
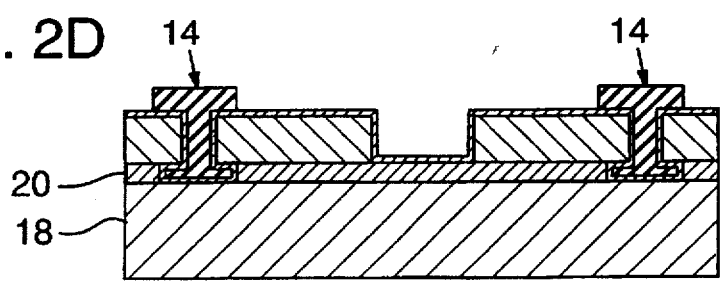

Formation of the bearing 14 begins by depositing a 1.5 micron thick silicon-rich silicon nitride layer by LPCVD. (Silicon-rich silicon nitride is used to lessen internal stresses in the bearing material and for its very small etch rate in HF.) Photoresist is again applied, exposed, and developed, and the wafer is then etched to form the bearing 14, as shown in FIG. 2D.

(Alternatively, the bearing 14 can be formed of polyimide. In this case the polyimide is spin cast and permitted to dry, letting the solvent evaporate. The wafer is then soft-baked in air for approximately 30 minutes at 350° C. to cure. A layer of aluminum, 0.1–0.2 microns thick, is next evaporated over the polyimide. Photoresist is then applied and the wafer exposed. After developing, the wafer is wet etched in $H_3PO_4$/$HNO_3$/acetic acid solution to remove aluminum where polyimide is not desired. Finally, the wafer is treated with an oxygen plasma, turning the unmasked polyimide into $CO_2$ and $NO_2$. The polyimide bearing then remains.)

It will be recognized that, since fabrication of the bearing 14 is the last step of the process before release, other bearing materials (discussed below) can be substituted with no change in the earlier fabrication steps.

(The HF etch rates of LPCVD silicon-rich nitride and polyimide are very small, making them compatible with polysilicon surface micromachining. Additionally, both materials can be deposited in processes that fill the flange mold, including the rotor/stator gap.)

Figure 2E:
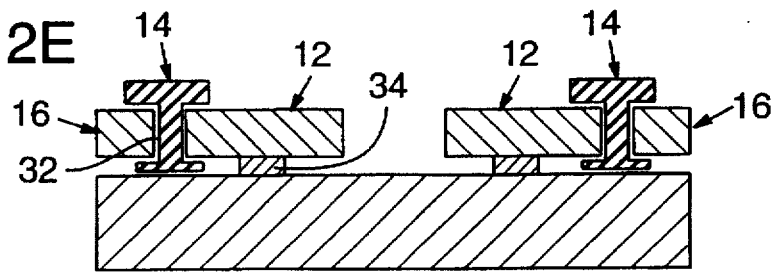

Finally, a HF bath is used to etch away the silicon dioxide LTO 20 underneath the rotor, freeing it for rotation (FIG. 2E). The oxide bearing clearance layer 30 over all the wafer is removed in this same process. The bath is timed so that the rotor is freed, while some of the LTO layer 20 underneath the stator poles persists, serving as anchors 34 to hold the stator in place. (A key to the successful fabrication of micromotors utilizing the present process is selection of the geometry of parts that are to be released (e.g. the rotor) such that they are released long before significant underetching of the remainder of the device (e.g. the stator).)

Outer-Rotor Micromotor Characteristics

In a presently preferred embodiment, that stator 12 has a radius of 100 microns. The rotor 16 has an inner radius of 101.5 microns, resulting in a rotor/stator gap of 1.5 microns. The rotor has a maximum outer radius (i.e. to the gear teeth) of 121 microns. The thickness of both the rotor and the stator is 5 microns. The flange bearing 14 has a mean radius of 100.75 microns and overhangs the rotor and stator approximately 4 to 5 microns. In the central portion of its "T" cross-sectional shape, bearing 14 has a thickness of 0.9 microns. (All dimensions are approximate.)

The above-described micromotor 10 operates smoothly and reproducibly in room air with a minimum operating voltage of approximately 14 volts. Power supply constraints have limited rotor speeds to 35 rpm, although higher speeds should be possible. If the rotor/stator thickness is decreased, the excitation voltage must be increased commensurately. A rotor/stator thickness of 2.5 microns, for example, may require a 100 volt excitation signal.

In the preferred embodiment, the motors operate successfully without grounding the rotor (i.e., the rotor is floating). In other embodiments, other approaches to ground the rotor are possible, such as a sliding contact to the rotor or by a grounded driven gear which the rotor drives.

The gear ratio (i.e. ratio of rotation of the stator field to the resulting physical rotation of the rotor) of an outer-rotor micromotor is given by dividing the bearing radius (against which the rotor rotates) by the bearing clearance. Since the bearing clearance is nominally 0.3 microns in the above-described process, a gear ratio of 333 would be expected for a micromotor having a bearing radius of 100 microns. In practice, the gear ratio is higher due to rotor slip. (As the excitation voltage increases, slip decreases, and the gear ratio more nearly conforms to its theoretical value.) Thus, to achieve a 35 rpm rotor speed, the stator poles $12a$–$12f$ are excited at a rotational rate of about 12 KHz.

The illustrated micromotor 10 achieves motive torques over 100 times larger than previously reported polysilicon micromotors. This substantial increase is due to the larger gear ratios (about 5 times), in addition to the larger motor radii (about 2 times), the thicker rotor/stator polysilicon (about 2 times), and the dielectric effect in the rotor/stator gap (about 5 times).

One feature of micromotor 10 is that the rotor/stator gap 26 is partly filled by the bearing material, which is electrically insulating. (In the illustrated embodiment, the gap is mostly filled.) Since the relative dielectric constant of an insulator is larger than 1, the motive torque is increased in comparison with conventional micromotor designs in which the rotor/stator gap is filled with air. The increase in the micromotor motive torque is nearly by as much as the dielectric constant if the bearing clearance is a small fraction of the rotor/stator gap size. Therefore, by using a material with a very high dielectric constant (i.e. more than 500) it is possible to increase the motive torque substantially. The silicon nitride used in the illustrative embodiment has a dielectric constant of about 7. However, materials with dielectric constants two to three orders of magnitude higher (e.g. thin-film PZT (lead zironate titanate), which has a dielectric constant of 800–1300, or barium-strontium titanate) can alternatively be utilized. Silicon nitride or polyimide is presently preferred by the inventors due to its ease of micromachining. (In most embodiments, the insulating member has a dielectric constant greater than two.)

Another feature of the above-described fabrication procedure is that the rotor/stator gap is defined in the first photolithography step. Since the lithography is performed on a flat surface, definition of rotor/stator features (e.g. gap) with 1 micron resolution in photoresist can be obtained. (Thermal oxidation for the bearing clearance creation consumes some of the rotor/stator sidewalls, leading to increased gap size in the final device. If a minimum gap is desired, the thermal oxidation step can be replaced with LTO deposition, readily eliminating the sidewall consumption effect.)

Inner Rotor Micromotor

Figure 3:
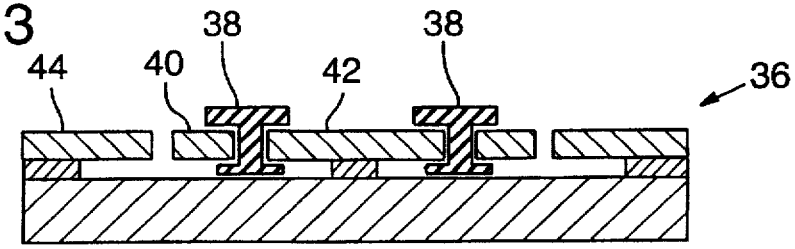
FIG. 3 is a cross sectional view showing an inner rotor micromotor according to one embodiment of the present invention.

An inner rotor micromotor 36 (FIG. 3) can be fabricated using the same basic process as was employed to fabricate the outer rotor micromotor 10. In the illustrated inner rotor micromotor 36, a flange bearing 38 couples the rotor 40 to a bearing post 42. Surrounding the rotor are the poles that comprise the stator 44. The difference in fabrication arises in formation of the bearing 38. Instead of using a silicon rich silicon nitride (or polyimide) material for the bearing, the illustrated micromotor 36 uses polysilicon. As in the outer rotor micromotor, a layer of the bearing material is applied over all surfaces of the wafer, and is then photographically patterned and etched to create the flange bearing. In this instance the bearing is conducting, rather than insulating. Again, a HF bath follows to release the rotor while keeping the stator and bearing post 42 anchored.

Conclusion

In keeping with the maxim that a patent should not teach, but preferably omit, what is known in the prior art, we have not belabored the steps and elements (e.g. generation of driving signals, connection of driving signals to stator poles, photolithographic processes, etc.) which are taken directly from the prior art. The reader who is not adequately versed in these areas may wish to consult the References Cited to gain additional understanding. Additional information on the preferred embodiments, such as experimental test data, can be found in Deng et al, "A Simple Fabrication Process for Side-Drive Micromotors," Proc. 7th International Conference on Solid-State Sensors and Actuators, June, 1993, pp. 756–759, and Deng et al, "Outer Rotor Polysilicon Wobble Micromotors," Proc. IEEE Micro Electro Mechanical Systems, January, 1994, pp. 269–272.

Having described and illustrated the principles of our invention with reference to illustrative embodiments and methods, and several variations thereof, it should be apparent that the disclosed embodiments and methods can be modified in arrangement and detail without departing from such principles. For example, while the preferred embodiment made use of a silicon wafer as a substrate, a variety of other materials (e.g. quartz, silicon carbide, fused silica, alumina, sapphire, and other silicon on insulator wafers, to name a few) could obviously be substituted therefor. Likewise with the constitution of the other component layers and bearing.

Similarly, while the illustrative embodiments made use of flange bearings, it will be recognized that other bearing shapes can be utilized in other applications. For example, the lower extension on flange 14 (i.e. next to the substrate) can be omitted, and bushings can be formed on the bottom of the rotor to prevent adhesion of the rotor to the substrate.

Still further, it will be appreciated that the fabrication processes and/or structures described above can be used as foundations on which more complex fabrication technologies and/or micromachined assemblies and/or mechanisms can based (e.g. by provision of additional masking and deposition steps). Indeed, a plurality of micromotors can be fabricated on a single substrate and operated in conjunction to effect a variety of mechanical systems. Further, electronic circuitry can be integrated with the micromotor(s) on the substrate to effect additional sensing and processing operations. In one such embodiment, a speed sensor is provided on-substrate and senses rotation of the rotor. This sensor can be implemented to utilize the stator poles as sensing elements.

While the illustrative embodiment includes 6 stator poles, it will be recognized that a greater or lesser number can be used in alternate embodiments. Similarly, while the illustrative embodiment has been described with reference to one particular set of dimensions, it will be recognized that physically larger or smaller embodiments can readily be realized. Even within the embodiment illustrated, the dimensions can be varied as application and fabrication needs dictate (e.g. in some circumstances it may be desirable to have a rotor/stator gap of up to 3 microns in the illustrated embodiment).

The geometrical arrangements described above are presently preferred, but a variety of other geometrical arrangements can also be utilized. For example, the insulated bearing, outer rotor structure can have its stators folded outside the rotor to result in an inner-rotor micromotor in which the rotor is coupled to the stators by a flange bearing between the outer edges of the rotor and the inner edge of the stators. This embodiment does not require a center bearing post and takes advantage of the dielectric constant of the flange bearing material to increase the motive torque.

In view of the wide variety of embodiments to which the principles of our invention can be applied, it should be apparent that the detailed embodiments are illustrative only and should not be taken as limiting the scope of our invention. Rather, we claim as our invention all such modifications as may come within the scope and spirit of the following claims and equivalents thereto.

We claim:

1. In a process of fabricating an outer rotor micromotor having a rotor and a stator on a substrate, the rotor not overlapping the stator, an improvement comprising:

fabricating the rotor in place; and defining a radial rotor/stator gap of less than 3.0 microns.

2. The process of claim 1 which further includes integrating electronic circuitry for use with the micromotor on the same substrate as the micromotor.

3. An outer rotor micromotor fabricated according to claim 1.

4. The micromotor of claim 3 which further includes an electrically insulating member having a dielectric constant greater than two disposed in said gap.

5. The micromotor of claim 4 in which the electrically insulating member is a flange bearing that serves to mechanically couple the rotor and stator.

6. The micromotor of claim 4 in which the electrically insulating member is not affixed to either the stator nor to the rotor, nor to said substrate.

7. A mechanical system including a plurality of micromotors according to claim 3.

8. The method of claim 1 which includes fabricating said rotor of polysilicon.

9. In a process of fabricating a micromotor on a substrate by a series of photolithographic steps, the micromotor having a rotor held in place by a flange, and a stator, an improvement wherein:

a gap between the rotor and stator is defined in a first of said photolithographic steps;

the flange is disposed between the rotor and stator and has a dielectric constant greater than two; and said flange is not affixed to either the stator nor to the rotor, nor to said substrate.

10. The method of claim 9 in which said flange has a dielectric constant of more than 500.

* * * * *